(12) United States Patent
Akiyama

(10) Patent No.: US 8,748,294 B2
(45) Date of Patent: Jun. 10, 2014

(54) SOS SUBSTRATE WITH REDUCED STRESS

(75) Inventor: Shoji Akiyama, Annaka (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 13/519,236

(22) PCT Filed: Dec. 27, 2010

(86) PCT No.: PCT/JP2010/073590
§ 371 (c)(1),
(2), (4) Date: Jun. 26, 2012

(87) PCT Pub. No.: WO2011/081146
PCT Pub. Date: Jul. 7, 2011

(65) Prior Publication Data
US 2012/0280355 A1    Nov. 8, 2012

(30) Foreign Application Priority Data

Dec. 28, 2009  (JP) ................. 2009-297994

(51) Int. Cl.
*H01L 21/30* (2006.01)
(52) U.S. Cl.
USPC ........... 438/459; 438/455; 438/478; 438/479; 257/347; 257/E21.121; 257/E21.122; 257/E21.567; 257/E21.568; 257/E27.112
(58) Field of Classification Search
CPC ............ H01L 21/2007; H01L 21/2011; H01L 21/76251; H01L 21/76254
USPC .................. 438/455, 459, 478, 479; 257/347, 257/E21.121, E21.122, E21.567, E21.568, 257/E27.112
See application file for complete search history.

(56) References Cited

U.S. PATENT DOCUMENTS

| 5,966,620 | A  | * | 10/1999 | Sakaguchi et al. | ............ | 438/455 |
| 6,224,668 | B1 | * | 5/2001  | Tamatsuka        | ............ | 117/84  |
| 6,838,358 | B2 | * | 1/2005  | Maurice et al.   | ............ | 438/458 |
| 6,969,668 | B1 | * | 11/2005 | Kang et al.      | ............ | 438/458 |
| 7,052,978 | B2 | * | 5/2006  | Shaheen et al.   | ............ | 438/463 |
| 7,235,462 | B2 | * | 6/2007  | Letertre et al.  | ............ | 438/455 |
| 7,601,613 | B2 | * | 10/2009 | Mitani           | ............ | 438/455 |
| 7,749,870 | B2 | * | 7/2010  | Kawai et al.     | ............ | 438/471 |

(Continued)

FOREIGN PATENT DOCUMENTS

| JP | 2003234455 A |   | 8/2003 |           |
| JP | 2007-214304  | * | 8/2007 | H01L 21/02 |

(Continued)

OTHER PUBLICATIONS

Toshio Yoshi et al., Improvement of SOS Device Performance by Solid-Phase Epitaxy, Japanese Journal of Applied Physics, vol. 21, (1982) Supplement 21-1, pp. 175-179.

(Continued)

*Primary Examiner* — Jay C Kim
(74) *Attorney, Agent, or Firm* — Lerner, David, Littenberg, Krumholz & Mentlik, LLP

(57) ABSTRACT

There is provided an SOS substrate with reduced stress. The SOS substrate is a silicon-on-sapphire (SOS) substrate comprising a sapphire substrate and a monocrystalline silicon film on or above the sapphire substrate. The stress of the silicon film of the SOS substrate as measured by a Raman shift method is $2.5 \times 10^8$ Pa or less across an entire in-plane area of the SOS substrate.

6 Claims, 2 Drawing Sheets

(56) References Cited

U.S. PATENT DOCUMENTS

| | | | |
|---|---|---|---|
| 7,781,305 B2* | 8/2010 | Henley et al. | 438/455 |
| 7,855,127 B2 | 12/2010 | Akiyama et al. | |
| 7,902,038 B2* | 3/2011 | Aspar et al. | 438/455 |
| 8,263,476 B2 | 9/2012 | Ohnuma | |
| 8,309,431 B2* | 11/2012 | Nguyen et al. | 438/458 |
| 2009/0061591 A1 | 3/2009 | Akiyama et al. | |
| 2012/0119336 A1 | 5/2012 | Akiyama | |
| 2012/0258554 A1* | 10/2012 | Belle | 438/4 |

FOREIGN PATENT DOCUMENTS

| | | | |
|---|---|---|---|
| JP | 2007214304 A | 8/2007 | |
| JP | 2007220900 A | 8/2007 | |
| JP | 2008198656 A | 8/2008 | |
| JP | 2008277501 A | 11/2008 | |
| JP | 2009506540 A | 2/2009 | |
| JP | 2009049387 A | 3/2009 | |
| JP | 2014003319 A | 1/2014 | |
| JP | 5420968 B2 | 2/2014 | |

OTHER PUBLICATIONS

Sadoh, et al., Deep states in silicon on sapphire by transient-current spectroscopy, Journal of Applied Physics, vol. 82, No. 10, Nov. 15, 1997, pp. 5261-5264.

Jibuti, et al., Photostimulated Relaxation of Internal Mechanical Stresses in Epitaxial SOS Structures, Technical Physics, 2008, vol. 3, No. 6, pp. 808-810.

International Search Report dated Mar. 29, 2011 for Application No. PCT/JP2010/073590.

Yukio Yasuda, "Electric and Crystallographic Properties of Single Crystal Film of Silicon on Sapphire", Applied Physics, 45 (1976) pp. 1172-1182 with translation of excerpt.

Yamichi Ohmura, "Residual Strain Effect on the Electrical Property of Silicon on Sapphire (SOS)", Applied Physics, 49 (1980) pp. 110-123 with translation of excerpt.

International Preliminary Report on Patentability for Application No. PCT/JP2010/073590 dated Mar. 29, 2011.

Office Action Japanese Patent Application No. 2009-297994, mailed Sep. 13, 2013.

Office Action for JP 2009-297994 Mailed Mar. 25, 2014.

* cited by examiner

SOS SUBSTRATE WITH REDUCED STRESS

CROSS REFERENCE TO RELATED APPLICATIONS

The present application is a national phase entry under 35U.S.C. §371 of International Application No. PCT/JP2010/073590, filed Dec. 27, 2010, published in Japanese, which claims priority from Japanese Patent Application No. 2009-297994 filed Dec. 28, 2009, all of which are incorporated herein by reference.

TECHNICAL FIELD

The present invention relates to an SOS substrate with reduced stress.

BACKGROUND ART

Conventionally, a silicon-on-sapphire (SOS) substrate including a handle substrate made of sapphire which has high insulating properties, low dielectric loss and high thermal conductivity has been put in practical use since the 1960s until now. The SOS substrate is the earliest silicon-on-insulator (SOI) substrate, in which an SOI structure is achieved by heteroepitaxially growing silicon on the R plane (1012) of sapphire at high temperature.

In recent years, however, SOI using a SIMOX method or a bonding method has become mainstream. Accordingly, the SOS substrate is used only in devices which are not compatible with SOI whose handle substrate is made of silicon, for example, in such devices as a high-frequency device requiring low dielectric loss. In heteroepitaxial SOS, silicon is heteroepitaxially grown on sapphire different by 12% in lattice constant from silicon. It is, therefore, known that many defects due to mismatch in lattice size occur in the SOS substrate (see, for example, Non-Patent Literature 1).

In recent years, there has been a growing demand for high-frequency devices because mobile communication devices typified by cellular phones have widely spread. Therefore, the utilization of SOS substrate in this field is under consideration. However, the reality is that heteroepitaxial SOS substrate is high in defect density, thus the use thereof is limited to small discrete components (switches and the like).

Another major problem in addition to the high defect density is excessive stress applied to a silicon film. In a conventional method, a silicon film is formed at 900° C. to 1000° C. Consequently, large compressive stress occurs in silicon when a silicon film, which was grown free of stress at the time of growth, is cooled to room temperature, since a thermal expansion coefficient of sapphire is large, compared with that of silicon. In such a case, stress is proportional to a difference between growth temperature and room temperature ($\Delta T$=875° C. to 975° C., when room temperature is 25° C.). It is pointed out that consequently, a change takes place in a conductor of silicon, and the mobility of electrons degrades to 80% or so (see, for example, Non-Patent Literature 2 and Non-Patent Literature 3). In addition, the stress of silicon grown as described above reportedly amounts to a compressive stress of $6.2 \times 10^8$ Pa (see, for example, Non-Patent Literature 4).

CITATION LIST

Non-Patent Literature

Non-Patent Literature 1: Yoshii et al. Japanese Journal of Applied Physics, Vol. 21 (1982) Supplement 21-1, pp. 175-179

Non-Patent Literature 2: Yukio Yasuda: Applied Physics, 45 (1976) pp. 1172

Non-Patent Literature 3: Yamichi Omura: Applied Physics, 49 (1980) pp. 110

Non-Patent Literature 4: J. Appl. Phys. 82 (1997) p. 5262

SUMMARY OF INVENTION

Technical Problem

In view of the above-described current situation, it is an object of the present invention to obtain an SOS substrate in which excessive stress applied to a silicon film is reduced.

Solution to Problem

In order to achieve the above-described object, the present inventor has reached the fabrication method described below.

That is, the present invention relates to a silicon-on-sapphire (SOS) substrate comprising a sapphire substrate and a monocrystalline silicon film on or above the sapphire substrate, wherein stress of the silicon film as measured by a Raman shift method is $2.5 \times 10^8$ Pa or less across an entire in-plane area of the SOS substrate.

A preferred aspect of the present invention is an SOS substrate obtained by a method comprising the steps in the following order of: implanting ions into a silicon substrate or a silicon substrate having an oxide film thereon to form an ion-implanted layer therein; performing a surface activation treatment on a surface of a sapphire substrate and/or a surface of the ion-implanted silicon substrate or the ion-implanted silicon substrate having an oxide film thereon; bonding the silicon substrate or the silicon substrate having an oxide film thereon and the sapphire substrate to each other at 50° C. or higher but not higher than 350° C., and then applying a heat treatment at 150° C. or higher but not higher than 350° C. to obtain a bonded body; embrittling an interface of the ion-implanted layer of the bonded body; and applying mechanical impact to the interface of the ion-implanted layer to split the bonded body along the interface, thereby transferring the silicon film to the sapphire substrate to form an SOS layer. The bonded body may be heated to temperature near bonding temperature (=bonding temperature ±50° C.) at the step of embrittling and at the time of split, in order to alleviate warpage.

Effect of the Invention

If the bonding temperature is 50° C. or higher but not higher than 350° C., the stress of silicon can be reduced significantly since the stress is determined by "bonding temperature−room temperature ($\Delta T$=25° C. to 325° C. when the room temperature is 25° C.)".

DESCRIPTION OF EMBODIMENTS

Figure 1:
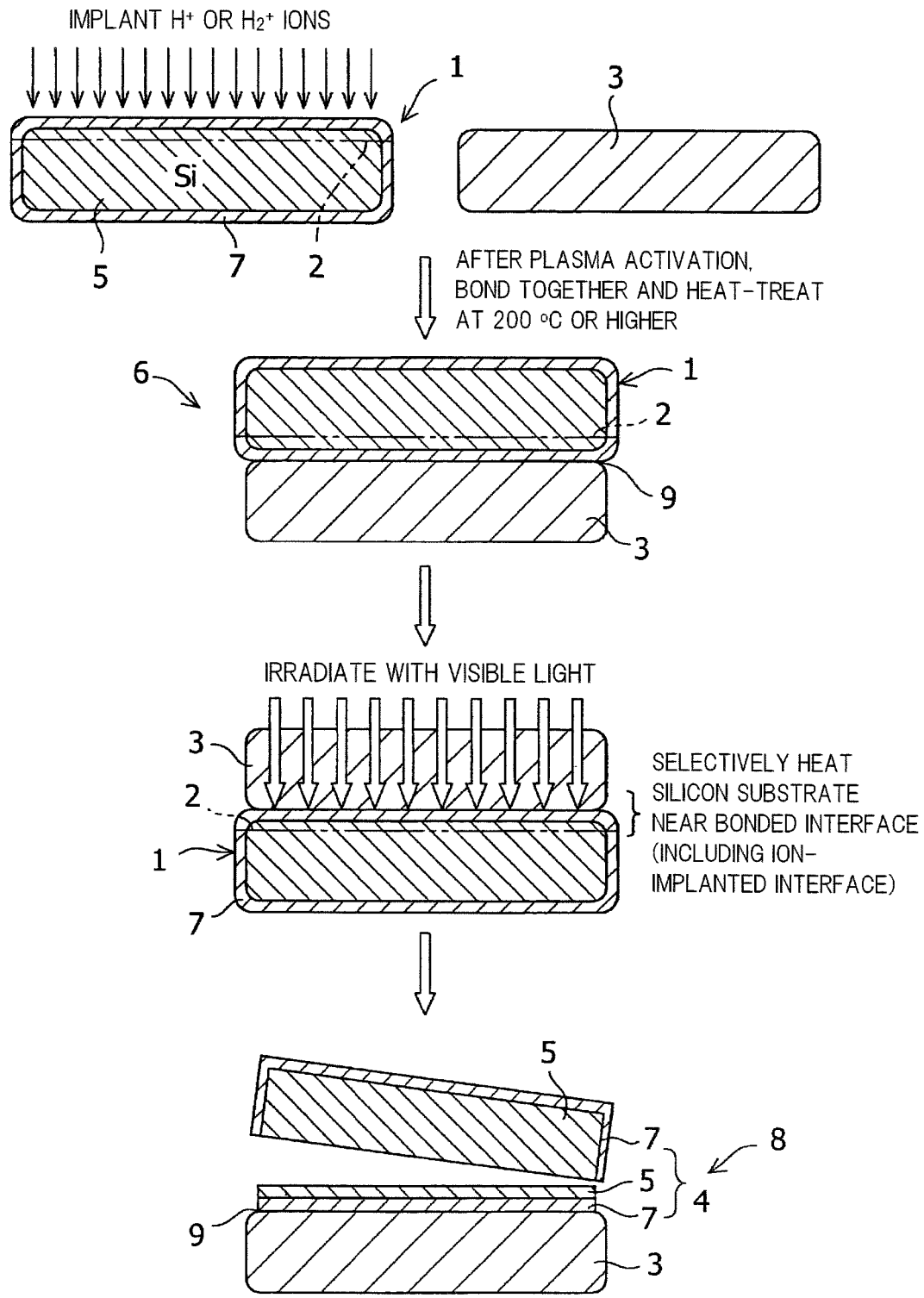
FIG. 1 illustrates one aspect of a method for manufacturing the SOS substrate according to the present invention.

An SOS substrate according to the present invention is a silicon-on-sapphire (SOS) substrate comprising a sapphire substrate and a monocrystalline silicon film on or above the sapphire substrate, wherein stress of the silicon film of the SOS substrate as measured by a Raman shift method is $2.5 \times 10^8$ Pa or less across an entire in-plane area of the SOS substrate. Herein, the stress of the silicon film of the SOS substrate is determined solely by a difference from stress of a monocrystalline silicon wafer as a reference.

The SOS substrate according to the present invention is preferably in such a form that a silicon dioxide film is present between the monocrystalline silicon film and the sapphire substrate. This is because there can be obtained the effect of suppressing the channeling of implanted ions. Such an SOS substrate is obtained by forming an insulating film, such as a silicon dioxide film, on a surface of a silicon substrate, prior to an ion implantation step in, for example, a later-described bonding method.

The silicon dioxide film can have a thickness on the order of several nm to 500 nm.

In the SOS substrate according to the present invention, the thickness of the monocrystalline silicon film can be set to 30 nm or greater. If the silicon film is thick, electrical characteristics are comparatively insensitive to thickness variations, and therefore, the SOS substrate has the advantage of being easy to handle. An upper limit of the thickness may be set to, for example, 500 nm. The film thickness of the monocrystalline silicon film is measured with an optical interferometry film thickness meter, and is a value averaged within a diameter of approximately 1 mm which is a diameter of a spot of measuring beam light.

In the SOS substrate according to the present invention, the thickness variation of the monocrystalline silicon film can be set to 20 nm or smaller. If the silicon film is thick, electrical characteristics are comparatively insensitive to thickness variations, and therefore, the SOS substrate has the advantage of being easy to handle. As the result of the thickness variation being small, it is possible to further improve the electrical characteristics of the SOS substrate according to the present invention. According to a later-described method for manufacturing the SOS substrate according to the present invention, split and transfer are performed along ion-implanted interface. Consequently, it is easy to control post-transfer film thickness variations to be within the above range. The thickness variation is a value defined by a square-root of the sum of squares of film thickness deviations from a mean value with respect to radially selected 361 measuring points.

In the SOS substrate according to the present invention, a stress variation of the monocrystalline silicon film within a wafer plane can be set to $0.5 \times 10^8$ Pa or smaller The SOS substrate has the advantage that a characteristic variation of a device is reduced as a result of stress variation within the wafer plane being reduced.

The stress variation refers to a variation of stress arising according to a position within the abovementioned wafer plane. Specifically, assuming that the stress of a wafer is concentrically identical, then the stress variation can be regarded as a difference in stress between portions near a substrate end face (peripheral parts) and portions near the center of the substrate.

Note that the stress variation is not a difference between absolute values of the stresses, but an absolute value of the difference between the stresses. That is, if compressive stress works in a peripheral part and tensile stress works in a central part, then an absolute value of a sum of these stresses corresponds to the stress variation.

The SOS substrate according to the present invention can be defined as one in which a difference of Raman shift of the SOS substrate is 1.0 cm$^{-1}$ or smaller in absolute value with respect to 520.50 cm$^{-1}$ which is the Raman shift observed in a usual monocrystalline silicon wafer, i.e., a monocrystalline silicon wafer alone. A more preferred upper limit of the difference is 0.9 cm$^{-1}$, and even more preferred upper limit of the difference is 0.8 cm$^{-1}$.

Since the difference being an absolute value, the difference can include both low-wave number-side shifts and high-wave number-side shifts.

The abovementioned Raman shift is a peak value of Raman-scattering light obtained by perpendicularly irradiating the light of an argon ion laser (514.5 nm in wavelength) from the sapphire substrate side of the SOS substrate to a region of 1 μm in diameter by using a lens system of a microscope, and detecting and measuring light Raman-scattering 180° backward from a sample through a spectroscope.

The abovementioned Raman shift is a value measured at a single point of a target location in a wafer plane.

Tensile stress moves a Raman peak toward the low-wavenumber side, whereas compressive stress moves the peak toward the high-wavenumber side.

Since the Raman peak shift is almost proportional to strain in usual stress deformation, and strain and stress are in a linear relationship, the Raman peak shift is almost proportional to stress.

The relationship between the Raman peak shift and stress can be represented by the following expression:

$$2.49 \times 10^8 (\text{Pa}) \times \Delta n (\text{change in the shift: cm}^{-1})$$

The abovementioned SOS substrate is preferably produced by the bonding method. The SOS substrate produced by the bonding method has the advantage of being able to reduce local stress acting on a vicinity of a sapphire/silicon interface, compared with an epitaxial growth method.

The bonding method may comprise, for example, a step of heat-treating a bonded body at approximately 500° C. tinder an inert gas atmosphere to perform thermal split by the effect of crystal reorientation and the aggregating effect of bubbles of implanted hydrogen; or a step of differentiating temperature between the two surfaces of a bonded substrate to perform split along a hydrogen ions-implanted interface. It is preferable, however, to adopt a method for manufacturing the SOS substrate according to the present invention.

Hereinafter, the method for manufacturing the SOS substrate according to the present invention will be described in detail according to FIG. 1.

First, ions are implanted into a semiconductor substrate, such as a silicon substrate or a silicon substrate having an oxide film thereon 1 (hereinafter, simply referred to as the silicon wafer unless distinctly specified), to form an ion-implanted layer 2.

The ion-implanted layer 2 is formed within the silicon wafer. At this time, a predetermined radiation dosage of hydrogen ions ($H^+$) or hydrogen-molecule ions ($H_2^+$) is implanted with such implantation energy as to be able to form the ion-implanted layer at a desired depth from the front surface of the wafer. An implantation energy at this time can be, for example, 30 to 100 keV.

The dose amount of hydrogen ions ($H^+$) to be implanted into the silicon wafer is preferably $5.0 \times 10^{16}$ atoms/cm$^2$ to $2.0 \times 10^{17}$ atoms/cm$^2$. If the dose amount is smaller than $5.0 \times 10^{16}$ atoms/cm$^2$, the embrittlement of an interface may not take place. If the dose amount exceeds $2.0 \times 10^{17}$ atoms/cm$^2$, gas bubbles may occur at the interface during post-bonding heat treatment, so that the transfer may fail. A more preferred dose amount is $7.0 \times 10^{16}$ atoms/cm$^2$.

The dose amount of hydrogen-molecule ions ($H_2^+$) to be implanted, is preferably $2.5 \times 10^{15}$ atoms/cm$^2$ to $1.0 \times 10^{17}$ atoms/cm$^2$. If the dose amount is smaller than $2.5 \times 10^{15}$ atoms/cm$^2$, the embrittlement of an interface may not take place. If the dose amount exceeds $1.0\times10^{17}$ atoms/cm$^2$, gas bubbles may occur at the interface during post-bonding heat treatment, so that the transfer may fail. A more preferred dose amount is $2.5\times10^{16}$ atoms/cm$^2$.

Next, a surface of the silicon substrate 1 and/or a surface of the sapphire substrate 3 is subjected to an activation treatment. Examples of a method of surface activation treatment include a plasma treatment, an ozone water treatment, a UV ozone treatment, and an ion beam treatment.

In the plasma treatment, the silicon substrate and/or the sapphire substrate subjected to RCA cleaning or the like is placed in a vacuum chamber, a gas for plasma is introduced under reduced pressure, and then the substrate or substrates are exposed to approximately 100 W of high-frequency plasma for 5 to 10 seconds, thereby plasma-treating a substrate surface or surfaces. As the gas for plasma in a case where the silicon substrate is treated, oxygen-gas plasma can be used if the surface of the silicon substrate is to be oxidized. If the surface of the silicon substrate is not to be oxidized, it is possible to use a hydrogen gas, an argon gas, a mixed gas of hydrogen and argon, or a mixed gas of hydrogen and helium. Any of these gases may be used to treat the sapphire substrate.

By performing plasma treatment, organic matter in the surface of the silicon substrate and/or the surface of the sapphire substrate is oxidized and removed. In addition, OH groups in the surface increase, and therefore, the surface is activated. The treatment is more preferably performed on both of an ion-implanted surface of the silicon substrate and a surface to be bonded of the sapphire substrate, but may be performed only on either one of the surfaces.

The ozone treatment is characterized in that an ozone gas is introduced into pure water and a wafer surface is activated with active ozone.

The UV ozone treatment is characterized in that short-wavelength UV light (approximately 195 nm in wavelength) is applied to an air or an oxygen gas to generate active ozone, thereby activating a surface.

The ion beam treatment results in surface activation by applying an ion beam of Ar or the like to a wafer surface in a high vacuum ($<1\times10^{-6}$ Torr), thereby exposing highly active dangling bonds.

A surface of the silicon substrate to be subjected to a surface activation treatment is preferably a surface into which ions have been implanted.

In the present invention, the thickness of the silicon substrate is not particularly limited. However, a silicon substrate having a regular thickness close to the SEMI/JEIDA standards is easy to deal with from the viewpoint of handling.

In the present invention, the thickness of the sapphire substrate is not particularly limited. However, a sapphire substrate having a regular thickness close to the SEMI/JEIDA standards is easy to deal with from the viewpoint of handling.

Next, the surface of this silicon substrate 1 and the plasma and/or ozone-treated surface of the sapphire substrate 3 are bonded to each other at a temperature of 50° C. or higher but not higher than 350° C. Temperature exceeding 350° C. may be undesirable because the difference between bonding temperature and room temperature becomes a major factor for the stress of silicon.

A heat treatment step for the purpose of obtaining such a bonded body as will be described later may be carried out subsequently to bonding, and then the bonded substrate may be cooled to room temperature. Alternatively, the bonded substrate may be temporarily cooled to room temperature after bonding, and then a heat treatment step may be carried out once again to obtain the bonded body.

The cooling is a step in which stress is generated. In particular, the cooling rate can be 5° C./min to 50° C./min.

Subsequently, a heat treatment at 150° C. or higher but not higher than 350° C. is performed on the bonded substrates to obtain a bonded body 6. The reason for performing the heat treatment is to prevent crystal defects from being introduced during later visible light irradiation. It is because a bonded interface 9 becomes hot and slipped due to a rapid temperature rise by the visible light irradiation to cause the crystal defects. The reason for setting the temperature to 150° C. or higher but not higher than 350° C. is that bonding strength does not increase at temperatures below 150° C. and that the bonded substrate may break at temperatures above 350° C.

Heat treatment time, though dependent to a certain degree on temperature, is preferably 12 to 72 hours.

Subsequently, mechanical impact may be applied to the vicinity of the bonded interface 9 at a side of the bonded body 6 prior to the step of embrittling the interface of an ion-implanted layer. By applying mechanical impact to the vicinity of the bonded interface, the starting point of split is limited to one place only in the embrittlement step. Accordingly, split extends from the point across the entire surface of a wafer, thereby offering the advantage that a film becomes easy to transfer.

Subsequently, a step of embrittling the interface of the ion-implanted layer is carried out. A method of embrittlement can include, for example, a method comprising a step of irradiating visible light from the sapphire substrate 3 side or the silicon substrate 1 side of the bonded body 6 toward the ion-implanted layer 2 of a silicon layer 5, thereby performing annealing.

In the present specification, "visible light" refers to light having the maximum wavelength within the range of 400 to 700 nm. The visible light may be either coherent light or incoherent light.

In the step of embrittling the interface of the ion-implanted layer and/or the step of applying the mechanical impact to the interface of the ion-implanted layer, the bonded body 6 is preferably subjected to a temperature of 50° C. or higher but not higher than 350° C., within a temperature range of 50° C. higher or lower than a temperature in the step of bonding. This is because the warpage of the bonded body 6 can be corrected for easy handling by making substrate temperature close to bonding temperature during splitting.

At the time of visible light irradiation, the bonded body 6 is preferably heated to a temperature of 50° C. or higher but not higher than 350° C., within a temperature range of 50° C. higher or lower than a temperature in the step of bonding, as described above.

The reason why it is desirable to perform light irradiation at temperature near the bonding temperature can be explained in the following manner, though this in no way restricts the technical scope of the present invention. When the substrates bonded together at high temperature are heated to attain sufficient bonding strength, and then brought to room temperature, the bonded substrates become warped due to a difference in the coefficient of expansion between the two substrates. An experiment made by the present inventors has revealed that if light is irradiated to these substrates, stress is rapidly released at the time of film transfer so that the substrates is driven to revert to a flat state, thus causing defects to be introduced into a semiconductor film being transferred and, in some cases, causing the substrates themselves to become broken.

Such substrate breakage can be avoided by performing light irradiation at high temperature, for example, light irradiation on the substrates mounted on a hot plate. In order to perform light irradiation on the flat substrates, it is desirable to heat the substrates to nearly the same temperature as the temperature at the time of bonding. The important point is that a wafer is heated at the time of irradiation.

If annealing is performed using laser light as one example of the visible light, the laser light is hardly absorbed by but passes through the sapphire substrate 3. Thus, the laser light reaches the silicon substrate 1 without heating the sapphire substrate 3. The laser light having thus reached the substrate selectively heats only the vicinity of the bonded interface 9 of silicon (including a bonded interface), particularly portions made amorphous by hydrogen ion implantation, thereby facilitating embrittlement of ion-implanted sites.

In addition, the SOS substrate of the present invention has the characteristic that only a small portion of the silicon substrate 1 (only the part of silicon in the vicinity of the bonded interface 9) is heated instantaneously so that neither substrate crack nor cooled substrate warpage is caused.

A laser wavelength to be used here is desirably a wavelength (700 nm or shorter) relatively easy to be absorbed by silicon. In addition, it is desirably the laser wavelength which is relatively easy to be absorbed by amorphous silicon but is hard to be absorbed by monocrystalline silicon portions, so that the portions made amorphous by hydrogen ion-implantation can be selectively heated. A suitable wavelength region is approximately 400 nm or longer but not longer than 700 nm, preferably 500 nm or longer but not longer than 600 nm. Examples of laser wavelength corresponding to this wavelength band include, but not limited to, the second harmonic wave (wavelength $\lambda=532$ nm) of an Nd:YAG laser and the second harmonic wave (wavelength $\lambda=532$ nm) of a $YVO_4$—laser.

It should be noted that if an ion-implanted portion 2 is overheated by laser irradiation, thermal split occurs in part, thus causing swell defects called blisters. These defects can be visually observed from the sapphire substrate side of the bonded SOS substrate. Once split begins due to these blisters, stress is localized in the bonded SOS substrate, thus causing the bonded SOS substrate to become broken. Accordingly, it is essential to irradiate laser to the extent of not causing thermal split, and then perform mechanical split. Alternatively, it is essential to apply mechanical impact to an edge portion of the bonded SOS substrate and to the vicinity of a bonded interface 9 prior to laser irradiation, so that thermal shock by laser irradiation causes destruction of the ion-implanted interface across the entire surface of the bonded SOS substrate from a starting point of the edge portion to which mechanical impact has been applied.

For laser irradiation conditions, it is empirically desirable that irradiation energy per unit area is 5 $J/cm^2$ to 30 $J/cm^2$ in cases where a laser having an oscillation frequency of 25 mJ@3 kHz at an output of 50 W to 100 W is used. The reasons for this are that if the irradiation energy is lower than 5 $J/cm^2$, embrittlement at the ion-implanted interface may not take place and that if the irradiation energy exceeds 30 $J/cm^2$, embrittlement is so intense that the substrate may break. Since irradiation is performed by scanning a spot of laser light over a wafer, it is difficult to specify the irradiation time to be used. However, the irradiation energy after treatment desirably falls within the above-described range.

It is also possible to perform an RTA (Rapid Thermal Anneal) including spike anneal, instead of such laser anneal as described above. The RTA refers to an apparatus capable of heating a wafer which is an object of annealing, so as to reach a target temperature at an extremely rapid rate of 30° C./sec to 200° C./sec, by using a halogen lamp as a light source. A wavelength of light emitted by the halogen lamp at this time is in the visible light region and the halogen lamp has high emission intensity according to black-body radiation. Spike anneal is not demarcated in particular from the other types of anneal, but refers to anneal, among the types of RTA, in which the rate of temperature rise is especially fast (for example, 100° C./sec or faster). Since spike anneal is extremely fast in temperature rise and sapphire is not heated in this wavelength band (by irradiation), silicon becomes hot earlier than sapphire. Thus, spike anneal is suitable for the embrittlement of ion-implanted interfaces. In the case of RTA, a process is completed by the time heat is sufficiently conducted to sapphire.

In addition, it is possible to perform flash lamp-based anneal in substitution for the above-described laser anneal. A flash lamp used here unavoidably has a certain wavelength band so long as it is a lamp. However, the flash lamp desirably has peak intensity in a wavelength band of 400 nm or longer but not longer than 700 nm (wavelength band efficiently absorbed by silicon). The reasons for this are that even monocrystalline silicon has a high absorption coefficient at wavelengths shorter than 400 nm and that even amorphous silicon becomes low in absorption coefficient at wavelengths longer than 700 nm. A suitable wavelength region is 400 nm or longer but not longer than 700 nm. As a lamp light source corresponding to this wavelength band, a xenon lamp is generally used for heating. The peak intensity (at wavelengths not longer than 700 nm) of the xenon lamp exists near 500 nm and is, therefore, suited for the purpose of the present invention.

Note that if xenon lamp light is used, irradiation may be performed through a wavelength filter for cutting off light outside a visible-light band. In addition, a filter or the like for blocking off visible light of 450 nm or shorter in which monocrystalline silicon has high absorption coefficient is also effective in process stabilization. In order to suppress the occurrence of the abovementioned blisters, it is desirable to irradiate the entire surface of the bonded SOS substrate with this xenon lamp light at the same time. This simultaneous irradiation makes it easy to prevent the stress localization of the bonded SOS substrate and, thereby, prevent the breakage thereof. Accordingly, it is essential to irradiate xenon lamp light to the extent of not causing thermal split, and then perform mechanical split. Alternatively, it is essential to apply mechanical impact to the vicinity of a bonded surface at an edge portion of the bonded SOS substrate prior to the irradiation of xenon lamp light, so that thermal shock by the irradiation of xenon lamp light causes destruction of the ion-implanted interface across the entire surface of the bonded SOS substrate from a starting point of the edge portion to which mechanical impact has been applied.

If a monocrystalline silicon film to the sapphire substrate cannot be transferred after laser light irradiation, RTA treatment, or flash lamp irradiation, it may be transferred to the sapphire substrate by applying mechanical impact to such interface to perform splitting along an interface of the ion-implanted layer.

In order to apply mechanical impact to the interface of the ion-implanted layer, a jet of a fluid such as a gas or a liquid may be continuously or intermittently sprayed from a lateral side of a bonded wafer. Methods for applying mechanical impact are not particularly limited as long as mechanical split is caused by impact.

A splitter is a device which can apply mechanical impact from a lateral side of the hydrogen ion-implanted layer of a bonded body 6 heat-treated at a temperature of 150° C. or higher but not higher than 350° C. Preferably, the splitter is sharp-pointed at a portion thereof which contacts the lateral side of the hydrogen ion-implanted layer, and is movable along the ion-implanted layer. The splitter is preferably a scissor-like acute-angled tool or a device having a scissor-like acute-angled blade. As the material of the splitter, it is possible to use plastic (for example, polyether ether ketone), zirconia, silicon, diamond, or the like. Metal or the like can also be used since contamination is not matter of concern. If contamination is a matter of concern, plastic may be used. Alternatively, a blade of scissors may be used as a wedge-shaped acute-angled tool.

In the above step of splitting, there is obtained an SOS substrate 8 in which a monocrystalline silicon film 4 is formed on the sapphire substrate 3.

A damage layer, approximately 150 nm in thickness, remains in a surface of the monocrystalline silicon film immediately after the above-described split, and therefore, CMP polishing is preferably performed on the surface. Removing the entirety of the damage layer by polishing increases film thickness variations, however. Accordingly, in an actual process, it is reasonable to use a method in which the most part of the damage layer is removed by a chemical etching method, and then the surface is mirror-finished by mirror-finish polishing.

An etching solution used in the above-described chemical etching is preferably a solution of one or more selected from the group consisting of ammonia hydrogen peroxide water, ammonia, KOH, NaOH, CsOH, TMAH, EDP and hydrazine. In general, an organic solvent is low in etching rate, compared with an alkaline solution, and is therefore suitable in cases where precise control of the amount of etching is required.

CMP polishing is performed in order to mirror-finish a surface, and is generally used to perform polishing to a depth of 30 nm or more.

After the above-described CMP polishing and mirror-finish polishing, wet process cleaning, such as RCA cleaning or spin cleaning and/or dry process cleaning, such as UV/ozone cleaning or HF vapor cleaning, may be performed.

Example 1

Figure 2:
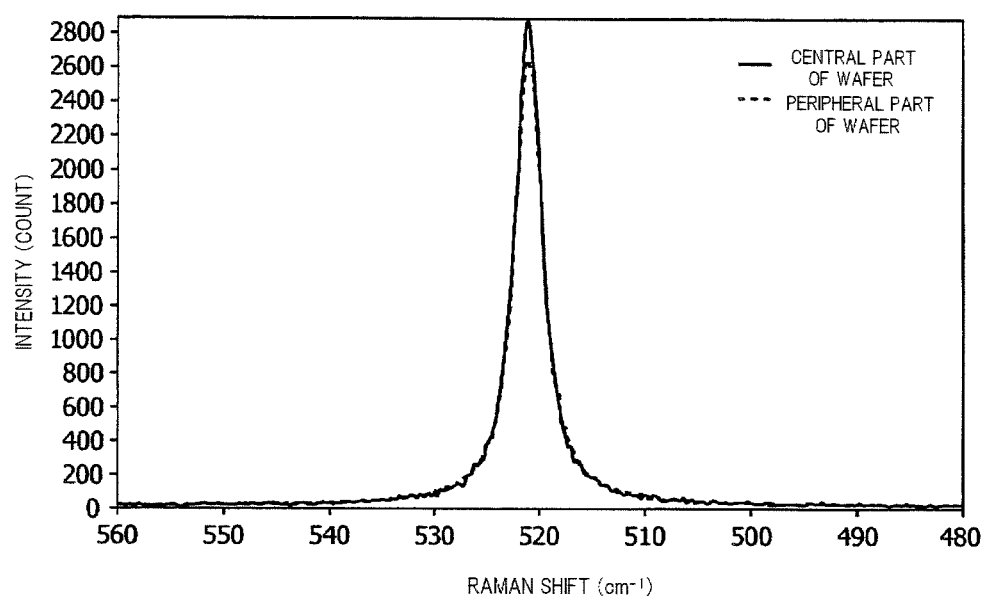
FIG. 2 illustrates a Raman spectrum measured at an interlaminar interface of the SOS substrate according to the present invention.

An oxide film was previously grown to a thickness of 200 nm on a silicon substrate (625 μm in thickness, 150 mm in diameter). Hydrogen ions ($H^+$) were implanted at 55 KeV and a dose amount of $7.0 \times 10^{16}$ atoms/$cm^2$ into the silicon substrate. Both surfaces of a sapphire substrate and the substrate were subjected to an ion beam activation treatment and bonded together at 200° C. The substrates were heat-treated at 225° C. for 24 hours and bonded together provisionally, and then cooled to room temperature. Subsequently, the bonded substrates were placed on a 200° C. hot plate, and mechanical impact was applied to a bonded interface to cause split, thereby transferring a silicon film to the sapphire substrate. Thus, transfer of the silicon film to an entire surface of the substrate could be confirmed. A silicon layer of this substrate was CMP-polished to have a thickness of 200 nm FIG. 2 illustrates results of Raman shift measurement of the silicon film. A Raman shift in a central part was 520.94 $cm^{-1}$, and a Raman shift in a peripheral part was 520.90 $cm^{-1}$. A Raman shift of a monocrystalline silicon wafer measured at the same time was 520.50 $cm^{-1}$. The stress was $1.10 \times 10^8$ Pa at the central part (single-point measurement) and was $1.00 \times 10^8$ Pa at the peripheral part (at a place 1 cm away from a wafer edge). The stresses showed a low value.

Example 2

An oxide film was previously grown to a thickness of 200 nm on a silicon substrate (625 μm in thickness, 150 mm in diameter). Hydrogen ions ($H^+$) were implanted at 55 KeV and a dose amount of $7.0 \times 10^{16}$ atoms/$cm^2$ into the silicon substrate. Both surfaces of a sapphire substrate and the substrate were subjected to a plasma activation treatment and bonded together at 350° C. The substrates were heat-treated at 225° C. for 24 hours and bonded together provisionally, and then cooled to room temperature. Subsequently, the bonded substrates were heated to 300° C. on a hot plate, and mechanical impact was applied to a bonded interface to cause split, thereby transferring a silicon film to the sapphire substrate. Thus, transfer of the silicon film to the entire surface of the substrate could be confirmed A silicon layer of this substrate was CMP-polished to have a thickness of 200 nm. A Raman shift in a central part was 521.28 $cm^{-1}$, and a Raman shift in a peripheral part was 521.10 $cm^{-1}$. A Raman shift of bulk silicon measured at the same time was 520.50 $cm^{-1}$. The stress was $1.94 \times 10^8$ Pa as a result of single-point measurement at the central part and was $1.49 \times 10^8$ Pa at the peripheral part (as a result of single-point measurement at a place 1 cm away from a wafer edge). An in-plane stress variation was not larger than $0.5 \times 10^8$ Pa.

Example 3

An oxide film was previously grown to a thickness of 200 nm on a silicon substrate (625 μm in thickness, 150 mm in diameter). Hydrogen ions ($H^+$) were implanted at 55 KeV and a dose amount of $7.0 \times 10^{16}$ atoms/$cm^2$ into the silicon substrate. Both surfaces of a sapphire substrate and the substrate were subjected to a plasma activation treatment and bonded together at 200° C. The substrates were heat-treated at 225° C. for 24 hours and bonded together provisionally, and then cooled to room temperature. Subsequently, the bonded substrates were heated to 250° C. on a hot plate and irradiated with a YAG laser of 523 nm in wavelength. Mechanical impact was applied to a bonded interface to cause split, thereby transferring a silicon film to the sapphire substrate. Thus, transfer of the silicon film to the entire surface of the substrate could be confirmed. A silicon layer of this substrate was CMP-polished to have a thickness of 200 nm. A Raman shift in a central part was 521.25 $cm^{-1}$, and a Raman shift in a peripheral part was 521.07 $cm^{-1}$. A Raman shift of bulk silicon measured at the same time was 520.47 $cm^{-1}$. The stress was $1.87 \times 10^8$ Pa at the central part (as a result of single-point measurement at the central part) and was $1.42 \times 10^8$ Pa at the peripheral part (as a result of single-point measurement at a place 1 cm away from a wafer edge). An in-plane stress variation was not larger than $0 5 \times 10^8$ Pa.

Example 4

An oxide film was previously grown to a thickness of 200 nm on a silicon substrate (625 μm in thickness, 150 mm in diameter). Hydrogen ions ($H^+$) were implanted at 55 KeV and a dose amount of $7.0 \times 10^{16}$ atoms/$cm^2$ into the silicon substrate. Both surfaces of a sapphire substrate and the substrate were subjected to a plasma activation treatment and bonded together at 200° C. The substrates were heat-treated at 225° C. for 24 hours and bonded together provisionally, and then cooled to room temperature. Subsequently, the bonded substrates were heated to 250° C. on a hot plate and irradiated with Xe flash lamp light. Mechanical impact was applied to a bonded interface to cause split, thereby transferring a silicon film to the sapphire substrate. Thus, transfer of the silicon film to the entire surface of the substrate could be confirmed. A silicon layer of this substrate was CMP-polished to have a thickness of 200 mm A Raman shift in a central part was 521.18 cm$^{-1}$, and a Raman shift in a peripheral part was 521.00 cm$^{-1}$. A Raman shift of bulk silicon measured at the same time was 520.50 cm$^{-1}$. The stress was $1.69\times10^8$ Pa at the central part (as a result of single-point measurement at the central part) and was $1.25\times10^8$ Pa at the peripheral part (as a result of single-point measurement at a place 1 cm away from a wafer edge). An in-plane stress variation was not larger than $0.45\times10^8$ Pa.

REFERENCE SIGNS LIST

1 Semiconductor substrate
2 Ion-implanted layer
3 Sapphire substrate
4 film layer
5 Silicon layer
6 Bonded body
7 Oxide film
8 Bonded SOS substrate
9 Bonded interface

The invention claimed is:

1. A method of preparing a a silicon-on-sapphire (SOS) substrate comprising the steps in the following order of:
   a) implanting ions into a monocrystalline silicon substrate or a monocrystalline silicon substrate having an oxide film thereon to form an ion-implanted layer therein;
   b) performing a surface activation treatment on at least one selected from the group consisting of: a surface of a sapphire substrate; a surface of the ion-implanted monocrystalline silicon substrate; or a surface of the ion-implanted monocrystalline silicon substrate having an oxide film thereon;
   c) bonding the monocrystalline silicon substrate or the monocrystalline silicon substrate having an oxide film thereon and the sapphire substrate to each other at a temperature range of 50° C. to 350° C., and then applying a heat treatment at a temperature range of 150° C. to 350° C. to obtain a bonded body;
   d) embrittling an interface of the ion-implanted layer of the bonded body by applying visible light irradiation to the bonded body, wherein the embrittling is performed at a temperature range of 50° C. to 350° C. and within the range of 50° C. lower than the temperature of the bonding step to 50° C. higher than the temperature of the bonding step,
   wherein a laser is used to apply the visible light irradiation and the irradiation energy per unit area is 5 J/cm2 to 30 J/cm2 and the oscillating frequency is 25 mJ@3 kHz at an output of 50 W to 100 W; and
   e) applying mechanical impact to the interface of the ion-implanted layer to split the bonded body along the interface, thereby transferring the substrate to form a silicon film.

2. The method of claim 1, wherein the step of applying the mechanical impact to the interface of the ion-implanted layer is performed at a temperature range of 50° C. to 350° C. and within the range of 50° C. lower than the temperature of the bonding step to 50° C. higher than the temperature of the bonding step.

3. The method of claim 1, wherein the ions are hydrogen ions or hydrogen-molecule ions.

4. The method of claim 1, wherein the surface activation treatment is selected from the group consisting of plasma treatment, ozone water treatment, UV ozone treatment, and ion beam treatment.

5. The method of claim 1, wherein a wavelength of the visible light is 400 nm to 700 nm.

6. The method of claim 1, wherein the mechanical impact is selected from the group consisting of a jet of fluid and a splitter.

* * * * *